United States Patent
Kim et al.

(10) Patent No.: US 10,504,430 B2
(45) Date of Patent: Dec. 10, 2019

(54) DISPLAY DEVICE WITH DUTY CONTROL FUNCTION AND DUTY CONTROL METHOD THEREOF

(71) Applicant: LG Display Co., Ltd., Seoul (KR)

(72) Inventors: Hyuckjun Kim, Goyang-si (KR); Bumsik Kim, Suwon-si (KR); Jaeyoon Bae, Seoul (KR); Seungtae Kim, Goyang-si (KR); Kyoungdon Woo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/835,774

(22) Filed: Dec. 8, 2017

(65) Prior Publication Data

US 2018/0174516 A1    Jun. 21, 2018

(30) Foreign Application Priority Data

Dec. 21, 2016 (KR) .................... 10-2016-0175625

(51) Int. Cl.
*G09G 3/3233* (2016.01)
*G09G 3/20* (2006.01)
(Continued)

(52) U.S. Cl.
CPC ....... *G09G 3/3233* (2013.01); *H01L 27/3276* (2013.01); *H01L 51/5203* (2013.01);
(Continued)

(58) Field of Classification Search
None
See application file for complete search history.

(56) References Cited

U.S. PATENT DOCUMENTS 6,917,350 B2 * 7/2005 Pae .................. G09G 3/3233
345/204
7,750,875 B2 * 7/2010 Kim .................. G09G 3/3233
345/82
(Continued)

FOREIGN PATENT DOCUMENTS

EP    2254109 A1    11/2010
EP    2983165 A1    2/2016

OTHER PUBLICATIONS

Extended European Search Report dated Mar. 12, 2018, issued in corresponding European Patent Application No. 17207790.1.

*Primary Examiner* — Chad M Dicke
(74) *Attorney, Agent, or Firm* — Morgan, Lewis & Bockius LLP

(57) ABSTRACT

A display device includes a display panel on which a plurality of pixels connected to data lines, reference lines, and gate lines are arranged, each pixel having an organic light emitting diode (OLED) and a driving thin film transistor (TFT); a data drive circuit to supply a data voltage to the data lines and a reference voltage to the reference lines; a gate drive circuit to generate a scan signal and a sensing signal and to supply the scan signal and the sensing signal to the gate lines, the scan signal being synchronized with the data voltage and the sensing signal being synchronized with the reference voltage; and a timing controller to divide one frame into a programming time, an emission time, and a non-emission time, and to control an emission duty by variably controlling the programming time based on an analysis of input image data.

14 Claims, 16 Drawing Sheets

(51) Int. Cl.
*H01L 27/32* (2006.01)
*H01L 51/52* (2006.01)

(52) U.S. Cl.
CPC ... *G09G 3/2081* (2013.01); *G09G 2310/0205* (2013.01); *G09G 2310/0264* (2013.01); *G09G 2310/04* (2013.01); *G09G 2320/103* (2013.01); *G09G 2360/16* (2013.01)

(56) References Cited

U.S. PATENT DOCUMENTS

| | | | | |
|---|---|---|---|---|
| 8,199,171 | B2* | 6/2012 | Inoue | G09G 3/3208 |
| | | | | 345/204 |
| 10,026,362 | B2* | 7/2018 | Li | G09G 3/3266 |
| 10,049,617 | B2* | 8/2018 | Shin | G06F 3/011 |
| 10,056,028 | B2* | 8/2018 | Yamamoto | G09G 3/30 |
| 2003/0174109 | A1* | 9/2003 | Tateuchi | G09G 3/3614 |
| | | | | 345/88 |
| 2006/0120357 | A1* | 6/2006 | Kawasaki | G09G 3/325 |
| | | | | 370/354 |
| 2008/0106554 | A1* | 5/2008 | Tsai | G09G 3/2011 |
| | | | | 345/690 |
| 2008/0204374 | A1* | 8/2008 | Weitbruch | G09G 3/3225 |
| | | | | 345/76 |
| 2009/0201231 | A1* | 8/2009 | Takahara | G09G 3/3233 |
| | | | | 345/76 |
| 2010/0295860 | A1* | 11/2010 | Somerville | G09G 3/3216 |
| | | | | 345/545 |
| 2010/0295861 | A1* | 11/2010 | Somerville | G09G 3/3216 |
| | | | | 345/545 |
| 2012/0026155 | A1* | 2/2012 | Komiya | G09G 3/003 |
| | | | | 345/213 |
| 2014/0104243 | A1 | 4/2014 | Sakariya et al. | |
| 2014/0152633 | A1* | 6/2014 | Park | G09G 3/3291 |
| | | | | 345/207 |
| 2015/0187277 | A1* | 7/2015 | Maeyama | G09G 3/3291 |
| | | | | 345/694 |
| 2016/0027382 | A1* | 1/2016 | Chaji | G09G 3/006 |
| | | | | 345/212 |
| 2017/0092178 | A1* | 3/2017 | Lee | H01L 27/1225 |
| 2017/0229068 | A1* | 8/2017 | Hasegawa | G09G 3/3233 |
| 2017/0345376 | A1* | 11/2017 | Tani | G09G 3/3233 |
| 2018/0033368 | A1* | 2/2018 | Chaji | H05B 37/02 |
| 2018/0144674 | A1* | 5/2018 | Gupta | G09G 3/006 |
| 2018/0144687 | A1* | 5/2018 | Lin | G09G 3/3258 |
| 2018/0224961 | A1* | 8/2018 | Yamamoto | G06F 3/044 |

* cited by examiner

DISPLAY DEVICE WITH DUTY CONTROL FUNCTION AND DUTY CONTROL METHOD THEREOF

This application claims the benefit of Korean Patent Application No. 10-2016-0175625 filed on Dec. 21, 2016, which is incorporated herein by reference for all purposes as if fully set forth herein.

BACKGROUND

Technical Field

The present invention relates to a display device and a driving method thereof.

Discussion of the Related Art

An active matrix-type electroluminescent display device includes a self-emitting Organic Light Emitting Diode (OLED), and has advantages of a fast response time, a high light emitting efficiency, high luminance, and a wide viewing angle.

An OLED serving as a self-emitting element includes an anode electrode, a cathode electrode, and an organic compound layer formed between the anode electrode and the cathode electrode. The organic compound layer includes a hole injection layer HIL, a hole transport layer HTL, a light emitting layer EML, an electron transport layer ETL, and an electron injection layer EIL. When a driving voltage is applied to the anode electrode and the cathode electrode, holes passing through the hole transport layer HTL and electrons passing through the electron transport layer ETL move to the light emitting layer EML and form excitons. As a result, the light emitting layer EML generates visible light.

The electroluminescent display device includes pixels each including an OLED, wherein the pixels are arranged in matrix, and adjusts luminance of the pixels in accordance with a gray level of video data. Each of the pixels includes a Thin Film Transistor (TFT) that controls a driving current flowing in an OLED in accordance with a voltage applied to a gate electrode and a source electrode of a corresponding pixel. In addition, a gray level (luminance) of each pixel is adjusted dependent upon an amount of light emitted by the OLED, which is proportional to the driving current.

FIG. 2 illustrates a circuit of an existing pixel, and FIG. 3 illustrates a driving waveform of FIG. 2.

Referring to FIGS. 2 and 3, a pixel PXL includes an Organic Light Emitting Diode (OLED), a plurality of Thin Film Transistors ST1 to ST3 DT, and two capacitors Cst1 and Cst2. In FIG. 2, "Coled" indicates a parasitic capacitance of the OLED.

The TFTs ST1 to ST2 DT are implemented as an n-type MOSFET (which is hereinafter referred to as an NMOS). In addition, for a low-speed driving, a first switch TFT ST1 is in the form of an NMOS-type oxide TFT having an excellent off-current characteristic, and other TFTs ST2 and ST3 DT are in the form of an NMOS-type LTPS TFT having an excellent response characteristic.

The pixel PXL is driven during a scanning period and an emission time Tem. The scanning period may be set as approximately one horizontal period 1H, and includes an initialization time Ti, a sampling time Ts, and a programming time Tw.

During the initialization time Ti, a predetermined reference voltage Vref is supplied to a data line DL. During the initialization time Ti, a voltage of the gate node Ng is initialized to the reference voltage Vref, and a voltage of a source node Ng is initialized to a predetermined initialization voltage Vinit.

During the sampling time Ts, an electric potential of the gate node Ng is maintained at the reference voltage Vref, but an electric potential of the source node Ns is increased by a drain-source current Ids. In this source-follower method, a gate-source voltage Vgs of the driving TFT DT is sampled to a threshold voltage Vth of the driving TFT DT, and the sampled threshold voltage Vth is stored in the first capacitor Cst1. At a time when the sampling time Ts is finished, a voltage of the gate node Ng becomes the reference voltage Vref and a voltage of the source node Ns becomes a voltage that corresponds to a difference between the reference voltage Vref and the threshold voltage Vth.

During the programming time Tw, the data voltage Vdata is applied to the gate node Ng, and a result of distribution of a voltage variation Vdata-Vref of the gate node Ng between the capacitors Cst1 and Cst2 is reflected to the source node Ns. Thus, the gate-source voltage Vgs of the driving TFT DT which corresponds to a desired driving current is programmed.

During the emission time Tem, the OLED emits light in accordance with the driving current to thereby realize luminance corresponding to image data.

In an existing display device, the programming time Tw is determined by a driving frequency. If the programming time Tw is determined, the emission time Tem is fixed as well.

FIG. 4 is a diagram illustrating a duty control method of the existing display device.

Referring to FIG. 4, a frame period of a display device is determined by a driving frequency, and accordingly, a programming time and an emission duty are fixed as well by the driving frequency.

In the course of inputting frame data, a period where data is not input between a previous frame data and a next frame data is a blank time BT. During the blank time BT, various control procedures may be performed to measure luminance or current of a pixel and improve degradation of image quality.

However, an emission duty is fixed by a programming time Tw, which is determined by a driving frequency, in the existing display device, and thus, there is a limitation in securing a blank time when resolution are enhanced. As a result, there is insufficient time for performing functions required to be done during the blank time, such as sensing luminance or current and improving image quality.

SUMMARY

Accordingly, embodiments of the present disclosure are directed to a display device and a driving method that substantially obviates one or more of the problems due to limitations and disadvantages of the related art.

Features and aspects of embodiments of the present disclosure will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a display panel on which a plurality of pixels connected to data lines, reference lines, and gate lines are arranged, wherein each of the pixels comprises an Organic Light Emitting Diode (OLED), a driving Thin Film Transistor (TFT) for controlling a driving current flowing in the OLED in accordance with a gate-source voltage; a data drive circuit configured to supply a data voltage to the data lines and a reference voltage to the reference lines; a gate drive circuit configured to generate a scan signal and a sensing signal and supply the scan signal and the sensing signal to the gate lines, wherein the scan signal is to be synchronized with the data voltage and the sensing signal is to be synchronized with the reference voltage; and a timing controller configured to divide one frame into a programming time, an emission time, and a non-emission time to drive the display panel, and control an emission duty by variably controlling the programming time based on a result of analysis of input image data, wherein the programming time is a period of time in which the gate-source voltage is set to be suitable for the driving current, the emission time is a period of time in which the OLED emits light in accordance with the driving current, and the non-emission time is a period of time in which the OLED stops emitting light.

When the result of analysis of the input image data shows that image data of one or more lines is maintained as identical data, the timing controller may control the gate drive circuit so that a gate output corresponding to the one or more lines are turned on simultaneously.

In a cinema view mode in which an empty area is displayed in upper and lower parts of the display panel, the timing controller may set the gate-source voltage for areas, except for the empty area, to be suitable for the driving current, so that the programming time is reduced.

The timing controller may control the gate drive circuit so that gate outputs corresponding to lines displaying the empty area are turned on at the same time.

When the emission time is reduced as a result of controlling of the emission duty, the timing controller may correct a voltage of input data so that a gate-source voltage to be input to a driving TFT of a corresponding OLED is increased.

When the emission time is reduced as a result of controlling of the emission duty, the timing controller may correct data Vdata, which is input to a driving TFT of a corresponding OLED, into a corrected data V'data based on the following equation:

$$V'_{data} = V_{data} \times \left(\frac{\text{Emission Time } Ref.}{\text{Emission Time}}\right)^2 \quad \text{[Equation]}$$

When controlling the emission duty, the timing controller may calculate a gray level of input image data, and, in response to the calculated gray level being equal to or less than a reference value, correct a gate-source voltage to be input to a driving TFT of a corresponding OLED.

In another aspect, a driving method of a display device which comprises a display panel on which a plurality of pixels connected to data lines, reference lines, and gate lines are arranged, wherein each of the pixels comprises an Organic Light Emitting Diode (OLED), a driving Thin Film Transistor (TFT) for controlling a driving current flowing in the OLED in accordance with a gate-source voltage, the method comprises: supplying a data voltage to the data lines and a reference voltage to the reference lines; generating a scan signal and a sensing signal and supplying the scan signal and the sensing signal to the gate lines, wherein the scan signal is to be synchronized with the data voltage and the sensing signal is to be synchronized with the reference voltage; and dividing one frame into a programming time, an emission time, and a non-emission time to drive the display panel, and controlling an emission duty by variably controlling the programming time based on a result of analysis of input image data, wherein the programming time is a period of time in which the gate-source voltage is set to be suitable for the driving current, the emission time is a period of time in which the OLED emits light in accordance with the driving current, and the non-emission time is a period of time in which the OLED stops emitting light.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
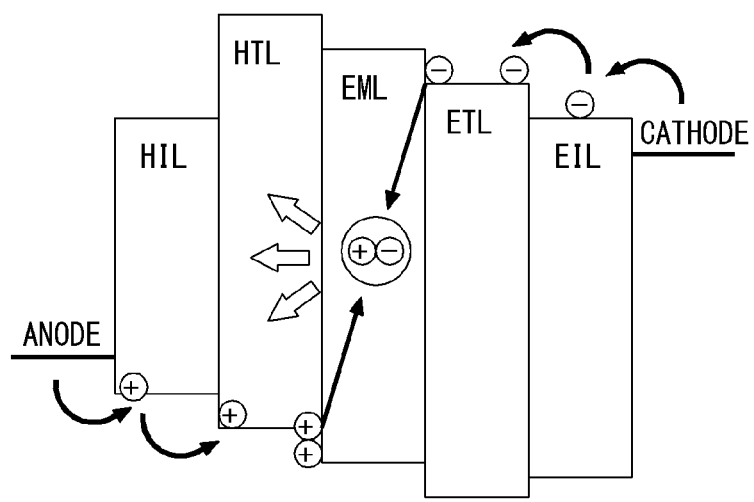
FIG. 1 is a diagram illustrating a general structure of an Organic Light Emitting Diode (OLED).
Figure 2:
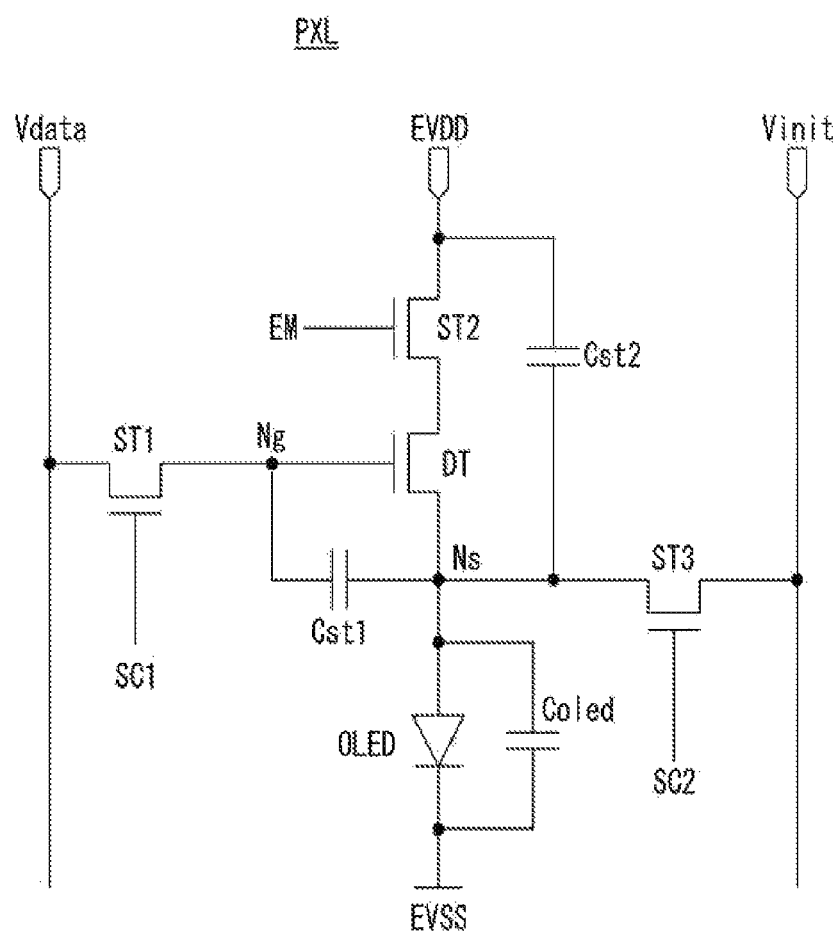
FIG. 2 is a diagram illustrating an existing pixel circuit.
Figure 3:
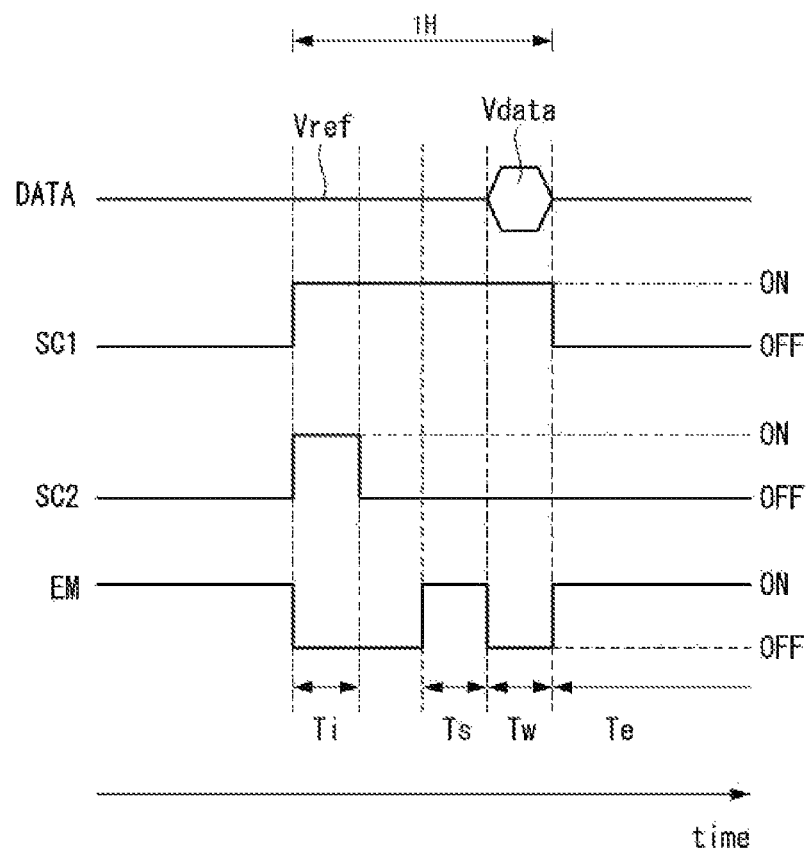
FIG. 3 is a diagram illustrating a driving waveform of FIG. 2.
Figure 4:
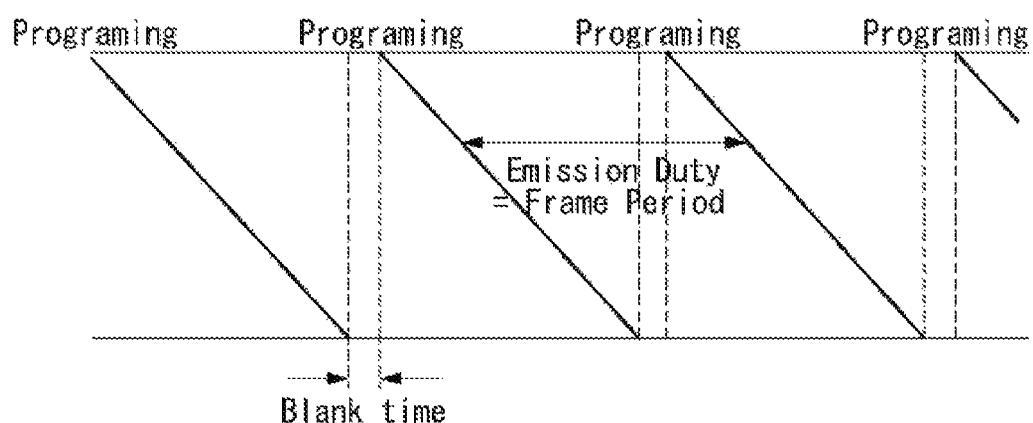
FIG. 4 is a diagram illustrating a duty control method of an existing display device.

Reference will now be made in detail to embodiments of the invention examples of which are illustrated in the accompanying drawings.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present invention, when a relationship of two elements is described using "on~", "above~", "below~", "next~", etc., this description should be construed as one or more elements can be positioned between the two elements unless "directly" is used.

In description of embodiments of the present invention, when an element or layer is "on" a different element or layer, this description should be construed in that another layer or element is on the different element or positioned between the two elements.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

The same reference numerals denote the same elements throughout the specification.

The size and thickness of each element in the drawings are illustrated by way of example, and aspects of the present invention are not limited thereto.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, various embodiments of the present invention will be described in detail with reference to the accompanying drawings.

Figure 5:
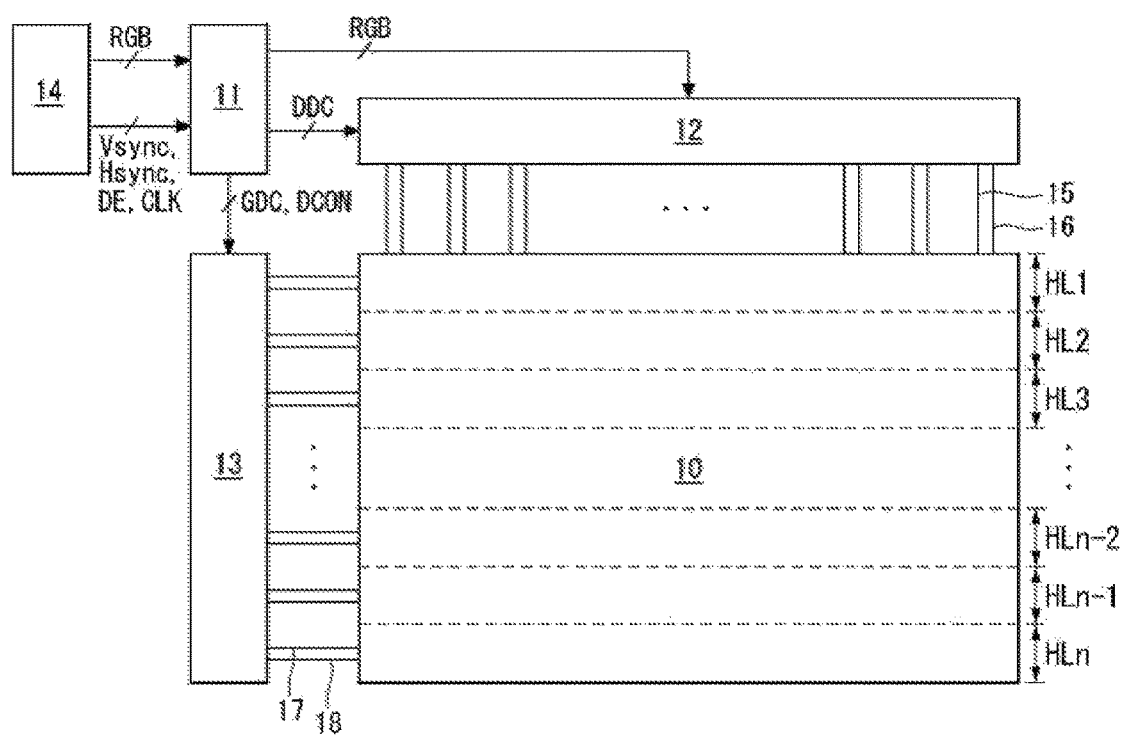
FIG. 5 is a block diagram illustrating a display device according to an embodiment of the present invention.

FIG. 5 is a block diagram illustrating a display device according to an embodiment of the present invention.

Referring to FIG. 5, a display device according to the present invention includes a display panel 10, a timing controller 11, a data drive circuit 12, and a gate drive circuit 13.

The display panel 10 includes a plurality of data lines 15, a plurality of reference lines 16, and a plurality of gate lines 17 and 18 intersecting each other. In addition, pixels each disposed at each intersection are arranged in matrix on the display panel 10 so as to form a pixel array. The pixel array includes a plurality of horizontal pixel lines, and one horizontal pixel line includes a plurality of pixels arranged neighboring each other in a horizontal direction.

The gate lines 17 and 18 may include: first gate lines 17 to which a scan signal is applied; and second gate lines 18 to which a sensing signal is applied. Each pixel may be connected to any one of the date lines 15, any one of the reference lines, any one of the first gate lines 17, and any one of the second gate lines 18. Each pixel includes an Organic Light Emitting Diode (OLED) and a driving Thin Film Transistor (TFT), and is able to enable a duty driving operation by controlling a programming time of the OLED within one frame.

Such a pixel is supplied from a power block with a high-electric potential driving voltage EVDD and a low-electric potential driving voltage EVSS. TFTs forming a pixel may be implemented as a P-type TFT, an N-type TFT, or a hybrid-type TFT. In addition, semiconductor layers of the TFTs forming a pixel may include amorphous silicon, a polysilicon, or an oxide.

Under the control of the timing controller 11, the data drive circuit 12 converts an input image data RGB into a data voltage and supplies the data voltage to the data lines 15. Under the control of the timing controller 11, the data drive circuit 12 generates a reference voltage and supplies the reference voltage to the reference lines 16.

Under the control of the timing controller 11, the gate drive circuit 13 generates a scan signal, which is to be synchronized with a data voltage, and then supplies the scan signal to the first gate lines 17. In addition, the gate drive circuit 13 generates a sensing signal, which is to be synchronized with a reference voltage and then supplies the sensing signal to the second gate lines 18. The gate drive circuit 13 may be embedded in a non-display area of the display panel 10, or may be in the form of an Integrated Circuit (IC) bonded to the display panel 10. The gate drive circuit 13 may supply a scan signal for a duty driving operation to pixels within one frame.

The timing controller 11 receives a timing signal, such as a vertical synchronization signal Vsync, a horizontal synchronization signal Hsync, a data enable signal DE, and a dot clock CLK, from the host system 14, and generates control signals for controlling operation timing of the data drive circuit 12 and the gate drive circuit 13. The control signals include a gate timing control signal GDC for controlling operation timing of the gate drive circuit 13, a source timing control signal DDC for controlling operation timing of the data drive circuit 12, and a programming control signal PCON for controlling a programming time of an OLED.

The programming control signal PCON may control high-speed programming through image analysis so as to reduce a programming time and therefore control an emission duty. For example, by turning on n number of gate outputs and selectively writing data of other gate outputs, it is possible to reduce a programming time. Generally, if there is a difference between an aspect ratio of image data and an aspect ratio of a display device, an area remaining empty at the aspect ratio of image data is displayed in black. As such, programming is not performed on an area in which the same data is displayed during image display is not programmed again, while programming is performed in an area in which data is changed. In doing so, it is possible to reduce a programming time and therefore change an emission duty.

The timing controller 11 controls operation of the gate driver circuit 13 to perform a duty driving operation, so that a copy of data of a previous frame is used in an area in which the same data is displayed during image display, such as a cinema mode screen, while programming is performed only in an area in which data is changed. In this manner the timing controller 11 is able to secure a blank time.

In a duty driving operation, if a gray level of image data RGB is in a low gray-level state indicating that the gray level of image data RGB is lower than a reference value, the timing controller 11 controls inputting of the image data by adjusting a voltage of the input data according to an adjusted duty. In doing so, it is possible to prevent a displayed image from being displayed too dark despite of adjustment of a duty. In addition, the timing controller 11 may improve image quality by inserting black data according to an adjusted duty. Using various well-known image analysis techniques, the timing controller 11 may analyze input a specific amount (e.g., one frame) of image data RGB. The timing controller 11 may calculate luminance of each pixel based on a result of analysis of the image data. The timing controller 11 may correct data Vdata to be written into a pixel, so that a loss of luminance caused by reduction in an emission time due to a duty driving operation is compensated.

Figure 6:
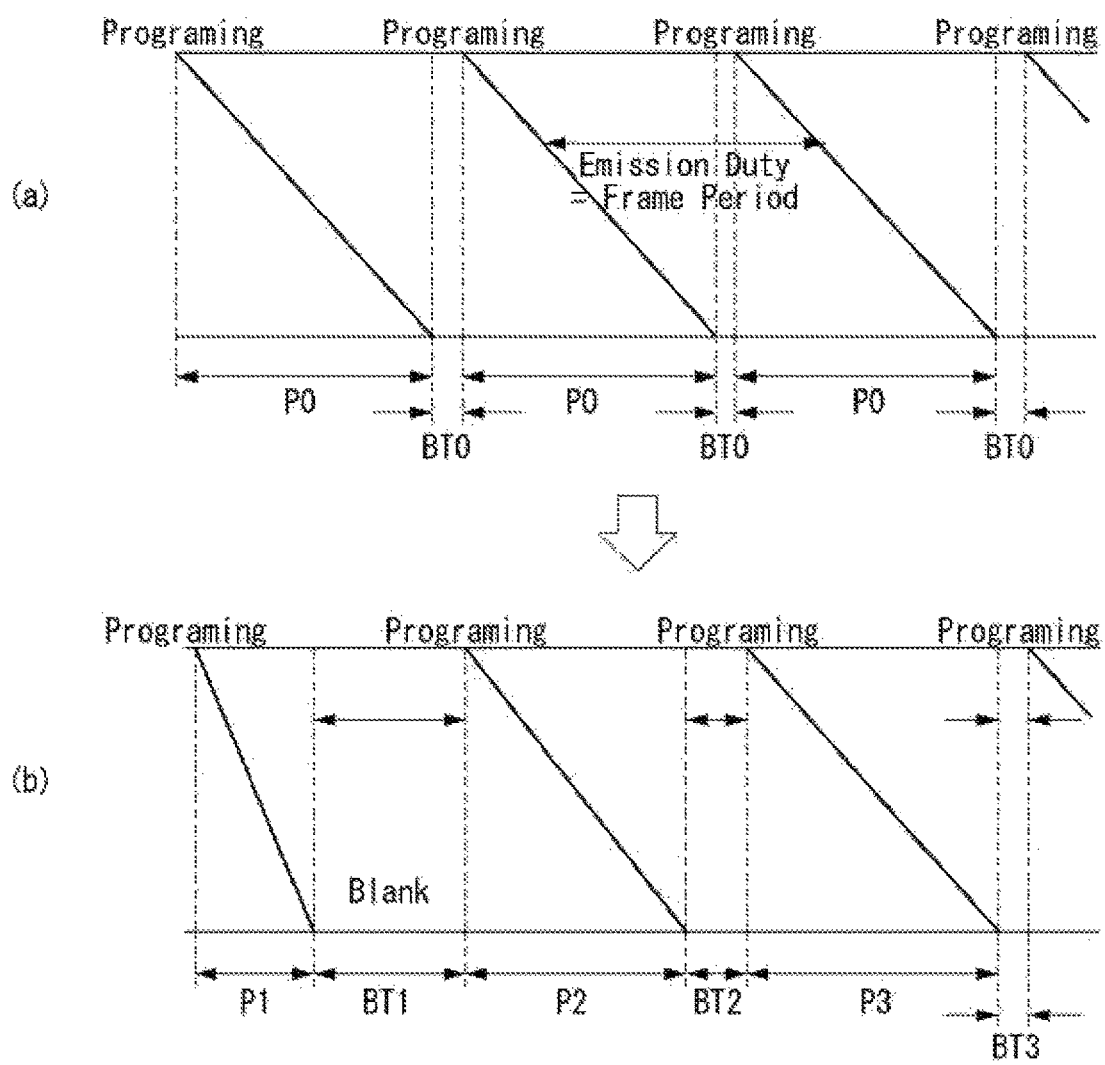
FIG. 6 is a diagram illustrating a duty control method according to an embodiment of the present invention.

FIG. 6 is a diagram illustrating a duty control method according to an embodiment of the present invention. To clarify the difference between the present invention and an existing technique, a conceptual diagram (a) of a duty control method of the existing technique and a conceptual diagram (b) of a duty control method of the present invention are presented.

Referring to (a) of FIG. 6, the duty control method according to the existing technique is implemented such that a frame period is determined by a driving frequency and accordingly a programming time P0 and an emission duty are fixed by the driving frequency. Because the emission duty is fixed dependent upon the programming time P0 which is determined by the driving frequency, even a blank time B0 is fixed as well. Thus, if resolution increases, there is a limitation in securing the blank time B0.

Referring to (b) of FIG. 6, the duty control method according to the present invention is implemented such that a frame period is determined based on a driving frequency but a programming time P1, P2, or P3 of each frame is able to be controlled through image analysis. As the programming times P1, P2, and P3 are controlled, even blank times BT1, BT2, and BT3 may be set different. If the programming time P1 is reduced, a longer blank time BT1 may be secured. The blank time secured as above may be used for performing various control functions, such as a real-time sensing function, a black-data writing function, and a driving TFT compensating function.

Figure 7:
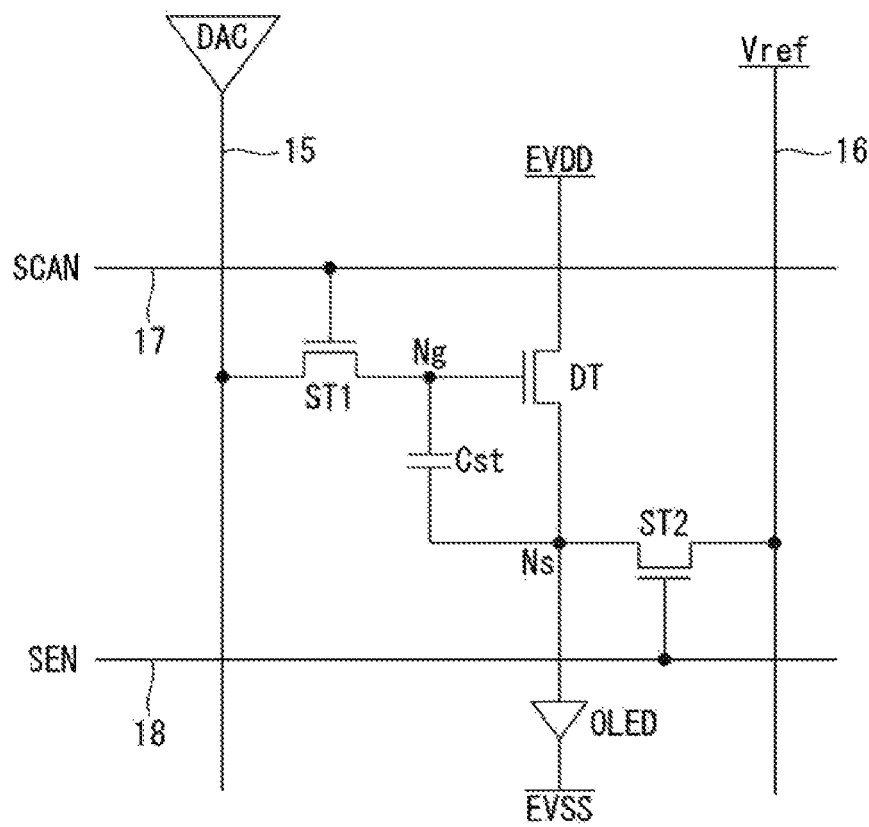
FIG. 7 is a diagram illustrating a configuration of a pixel required to implement a duty control method according to an embodiment of the present invention.

FIG. 7 shows a configuration of a pixel for implementing a duty control method according to the present invention.

Referring to FIG. 7, a pixel according to the present invention may include an OLED, a driving TFT DT, a storage capacitor Cst, a first switch TFT ST1, and a second switch TFT ST2.

The OLED includes an anode electrode connected to a source node Ns, a cathode electrode connected to an input stage of the low-electric potential driving voltage EVSS, and an organic compound layer disposed between the anode electrode and the cathode electrode.

The driving TFT DT controls a driving current that flows in the OLED due to a voltage difference between a gate node Ng and the source node Ns. The driving TFT DT includes a gate electrode connected to the gate node Ng, a drain electrode connected to an input stage of the high-electric potential driving voltage EVDD, and a source electrode connected to the source node Ns. The storage capacitor Cst is connected between the gate node Ng and the source node Ns.

The first switching TFT ST1 switches a current flow between a data line 15 and the gate node Ng in response to a scan signal SCAN so as to apply a data voltage of the data line 15 to the gate node Ng. The first switch TFT ST1 includes a gate electrode connected to a first gate line 17, a drain electrode connected to the data line 15, and a source electrode connected to the gate node Ng.

The second switch TFT ST2 switches a current flow between a reference lien 16 and the source node Ns in response to a sensing signal SEN so as to apply a reference voltage Vref of the reference line 16 to the source node Ns. The second switch TFT ST2 includes a gate electrode connected to a second gate line 18, a drain electrode connected to the reference line 16, and a source electrode connected to the source node Ns.

Such a pixel's one frame for a duty driving operation includes: a programming time Tp in which a voltage between the gate node Ng and the source node Ng is set to be suitable for a driving current; an emission time Te in which an OLED emits light in accordance with the driving current; and a non-emission time Tb in which the OLED stops emitting light.

Figure 8A:
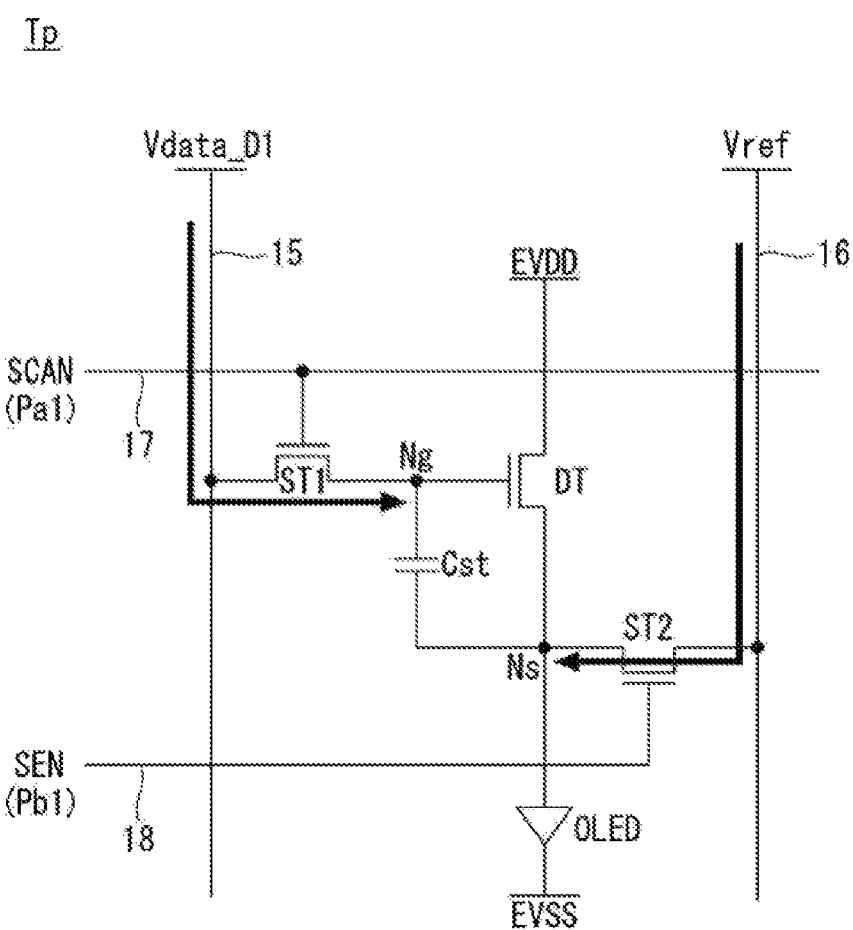
FIG. 8A is an equivalent circuit of a pixel corresponding to a programming time shown in FIG. 7.
Figure 8B:
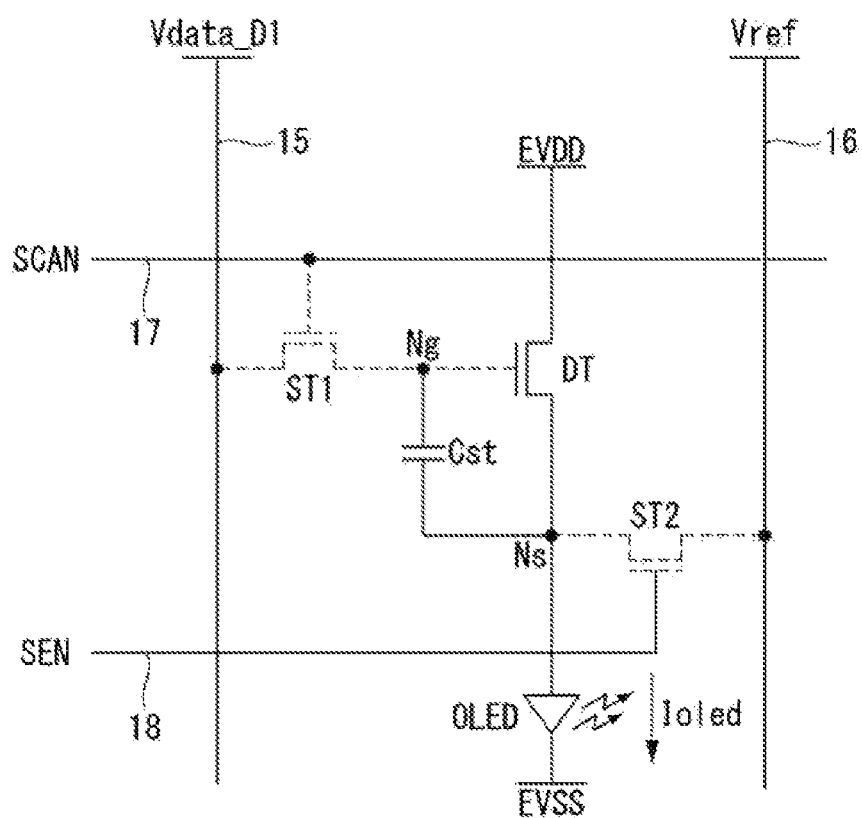
FIG. 8B is an equivalent circuit of a pixel corresponding to an emission time shown in FIG. 7.
Figure 8C:
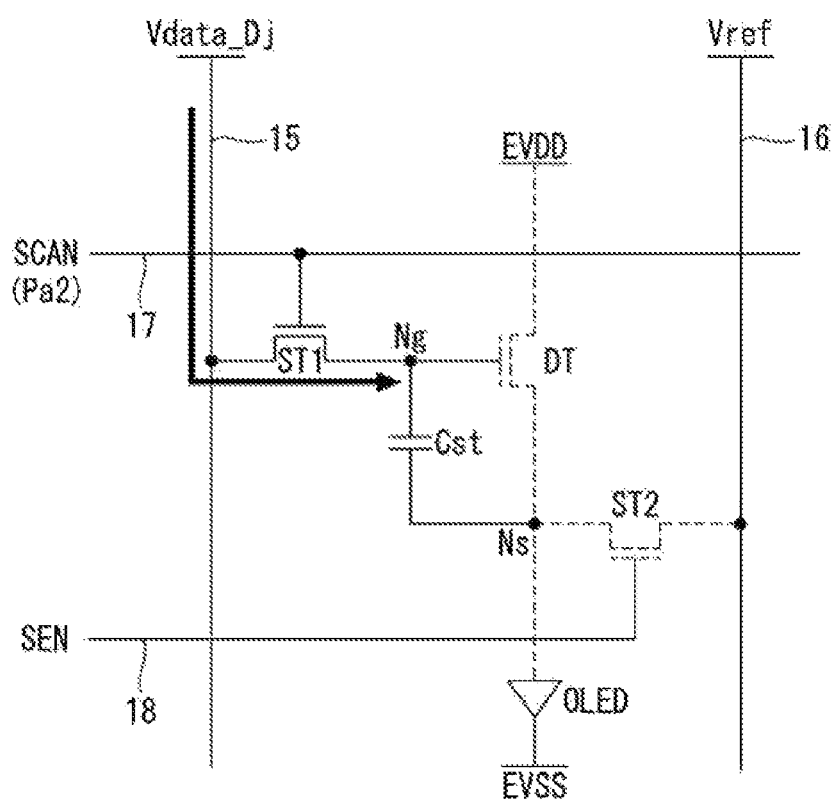
FIG. 8C is an equivalent circuit of a pixel corresponding to a non-emission time shown in FIG. 7.

FIG. 8A is an equivalent circuit of a pixel corresponding to a programming time Tp shown in FIG. 7, FIG. 8B is a equivalent circuit of a pixel corresponding to an emission time Te shown in FIG. 7, and FIG. 8C is an equivalent circuit of a pixel corresponding to a non-emission time Tb shown in FIG. 7.

Referring to FIG. 8A, during a programming time Tp, a first switch TFT ST1 of a first pixel is turned on in response to a first scan pulse Pa1 and then applies a first data voltage D1 to the gate node Ng. During the programming time Tp, a second switch TFT ST2 of the first pixel is turned on in response to a first sensing pulse Pb1 of a sensing pulse SEN and then applies to a reference voltage Vref to the source node Ns. In doing so, a voltage between the gate node Ng and the source node Ns of the first pixel is set suitable for a driving current. The present invention may correct a data Vdata, which is written into a pixel, so as to compensate for a loss of luminance caused by reduction in an emission time due to a duty driving operation for controlling a duty. In particular, a low gray-level image (e.g., being equal to or less than 30~40 gray) may be affected by a more severe degradation of image quality due to a loss of luminance, and thus, a data of a higher voltage is input in order to compensate for the loss of luminance.

Referring to FIG. 8B, during an emission time Te, a first switch TFT ST1 of the first pixel is turned off in response to a scan signal SCAN, and a second switch TFT ST2 of the first pixel is turned off in response to a sensing signal SEN. During a programming time Tp, a preset voltage Vgs between the gate node Ng and the source node Ns of the first pixel is maintained even during the emission time Te. Because the voltage Vgs between the gate node Ng and the source node Ns is greater than a threshold voltage Vth of a driving TFT DT of the first pixel, a driving current flows in the driving TFT during the emission time Te. While the voltage Vgs between the gate node Ng and the source node Ns is maintained by the driving current during the emission time Te, an electric potential of the gate node Ng and an electric potential of the source node Ns are boosted respectively. If the electric potential of the source node Ns is boosted to an operating level of an OLED, an OLED of the first pixel emits light. The present invention writes a corrected data so as to compensate for a loss of luminance lost caused by reduction in an emission time due to a duty control operation. Accordingly, a greater current is input to the OLED of the first pixel and the OLED emits light for a relatively short period of time, and therefore, it is possible to prevent degradation of image quality due to controlling a duty.

Referring to FIG. 8C, during a non-emission time Tb, a first switch TFT ST1 of the first pixel is turned on in response to a second scan pulse Pa2 of a scan signal SCAN to apply a j-th data voltage Dj to a gate node Ng. In addition, a second switch TFT ST2 of the first pixel remains turned off in response to a sensing signal SEN. The j-th data voltage Dj corresponds to input image data which is to be applied to the j-th pixel. The first pixel and the j-th pixel shares one data line, and the non-emission time Tb of the first pixel overlaps a programming time of the j-th pixel. Thus, the j-th data voltage Dj is applied not just to a gate node of the j-th pixel, but to a gate node Ng of the first pixel. When the j-th data voltage Dj is applied during the non-emission time Tb, an electric potential of the gate node Ng of the first pixel falls down from a boosting level to the j-th data voltage Dj, and an electric potential of the source node Ns of the first pixel is maintained at an operating level of an OLED.

Figure 9:
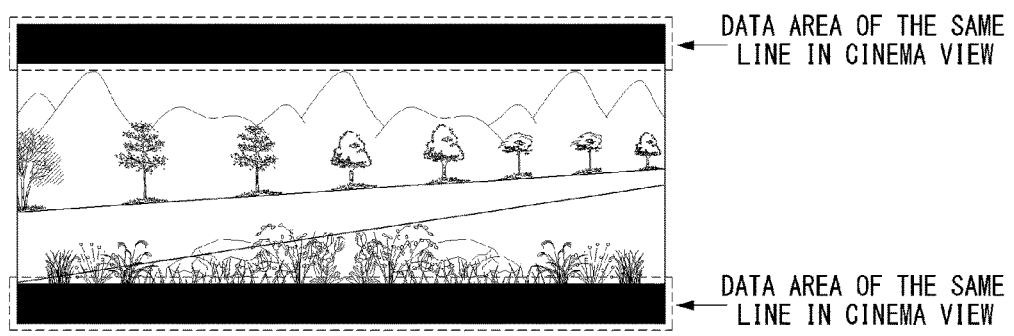
FIG. 9 is a diagram illustrating an example of an image displayed on a display device according to an embodiment of the present invention.
Figure 10:
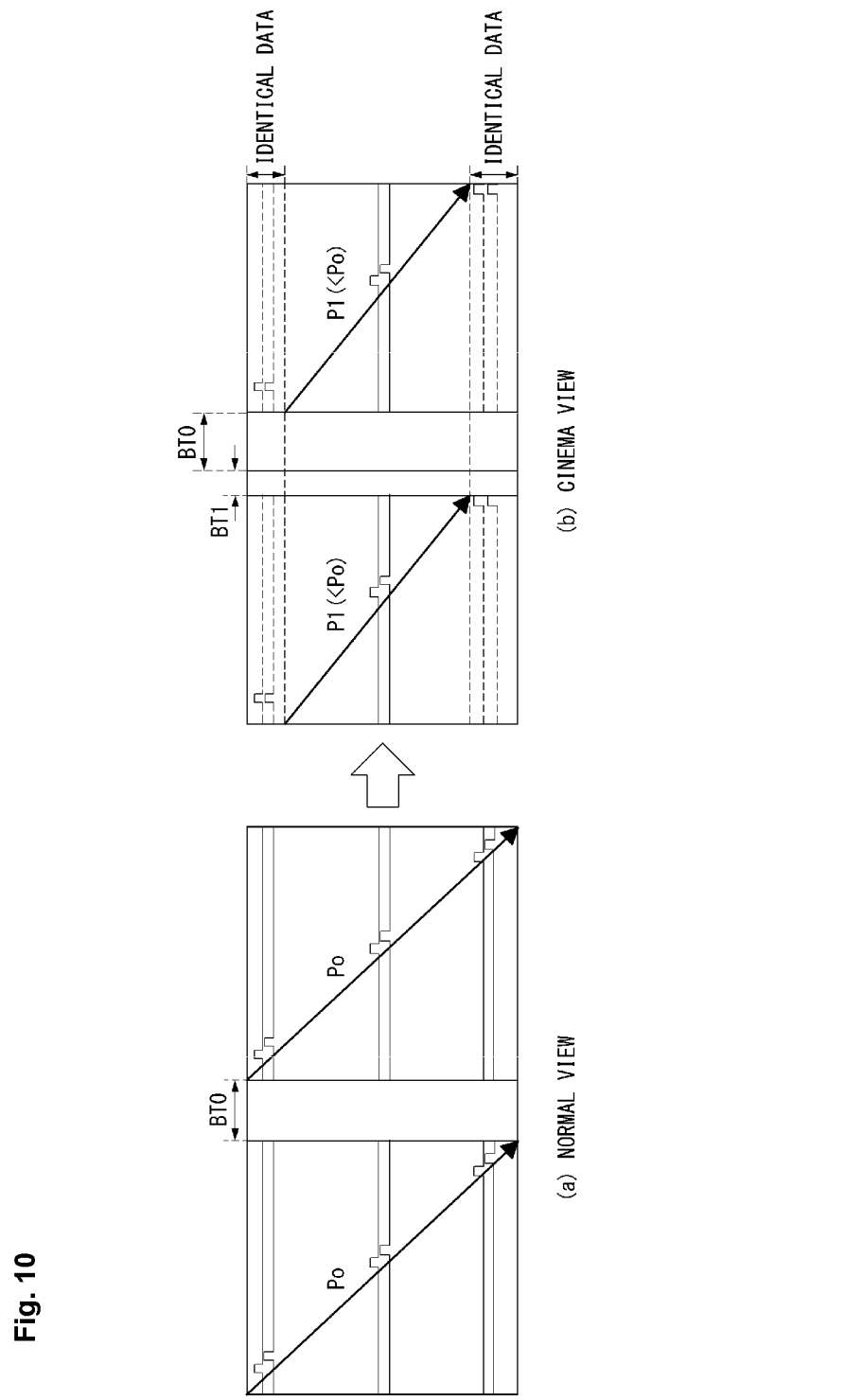
FIG. 10 is a diagram illustrating a duty control method implemented on an image which is displayed on the display device shown in FIG. 9.

FIG. 9 is a diagram illustrating an example of an image displayed on a display device according to an embodiment of the present invention, and FIG. 10 is a diagram illustrating a duty control method implemented on an image displayed on the display device shown in FIG. 9.

As illustrated in FIG. 9, when a display device operates in a specific mode such as a cinema view mode, a black empty area occurs in the upper and lower parts of a screen of a display device without cutting an image. The black empty area in the upper and lower parts of the screen is maintained until the cinema view mode is finished. Thus, the timing controller 11 does not program an image data into the black empty area and instead controls n number of gate outputs of the black empty area to be turned on at the same time so as to keep the empty area being displayed.

Referring to (a) of FIG. 10, in the case of an image of a normal view mode, data needs to be programmed into pixels in all lines required to display one frame. Thus, a programming time P0 may be determined by a driving frequency. As the programming time P0 is fixed, a blank time BT is fixed as well.

In contrary, in a cinema view mode as in FIG. 9, a black empty area in the upper and lower parts of the screen is maintained until the cinema mode is finished. Thus, the timing controller 11 does not program image data into the empty area and instead control data of a previous frame to be displayed. Accordingly, because it is possible to perform programming of only pixel data in a line, except for the empty area, a programming time P1 may be set, which is reduced compared to the previous programming time P0. As a result, it is possible to secure a blank time BT1 which has been increased as much as the reduction from the programming time P0 to the programming time P1.

As such, by reducing a programming time based on characteristics of image data, the present invention may control an emission duty to thereby secure a blank time.

Meanwhile, if a duty of every frame is changed, there may be a difference in luminance between lines. In particular, a low gray-level image may be affected by a severe degradation of image quality due to a loss of luminance. In such a case, in order to compensate for the loss of luminance, correction may be performed by increasing a current value in a corresponding pixel. Hereinafter, a method of compensating for a loss of luminance in response to a duty variation will be described in detail.

Figure 11:
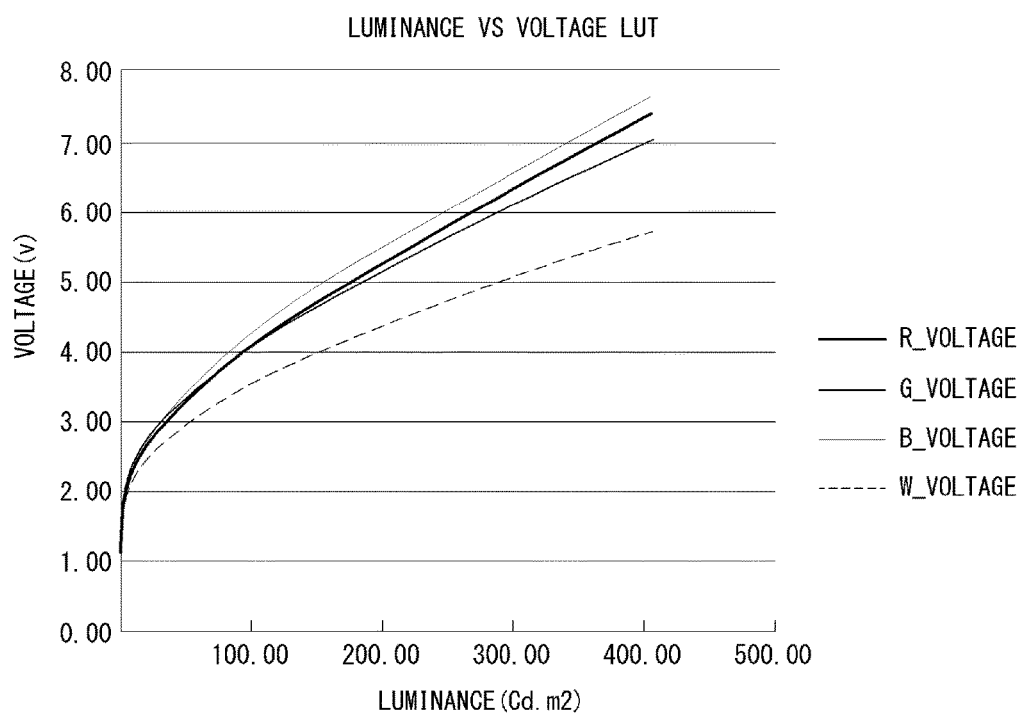
FIGS. 11 and 12 are graphs illustrating a variation in luminance of an OLED according to variation in Vgs and a current.
Figure 12:
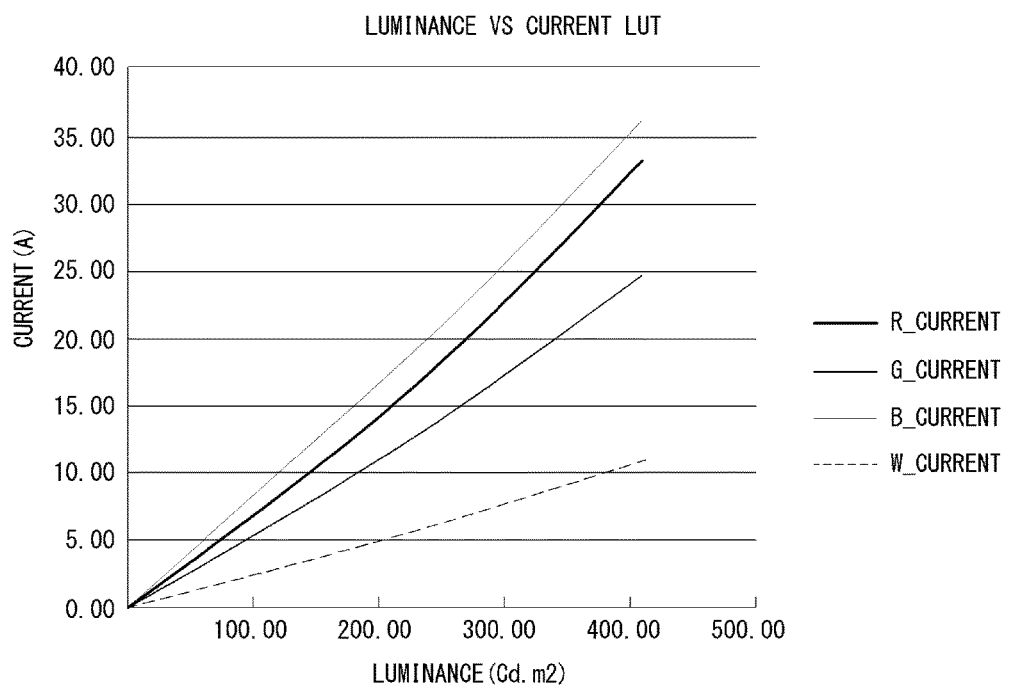

FIGS. 11 and 12 are graphs illustrating a variation in an OLED driving current in accordance with an emission duty.

As described above with reference to FIG. 7, a driving TFT DT controls a driving current which flows in an OLED in accordance with a difference in voltages between a gate node Ng and a source node Ns. Thus, the lower Vgs applied to the driving TFT DT, the greater parasitic capacitance or deviation of parasitic capacitance of the driving TFT DT. Therefore, degradation of image quality is likely to occur in a low gray-level area due to a low value of Vgs.

As illustrated in FIG. 11, if luminance (cd/m2) is reduced, a voltage Vgs of the driving TFT is reduced as well. As illustrated in FIG. 12, if luminance (cd/m2) is reduced, a current A for driving an OLED is reduced as well. As such, due to the reduction in the driving voltage and current, a parasitic capacitance and a deviation thereof in the driving TFT increase, and therefore, degradation of image quality and difference in luminance between lines may occur.

The difference in luminance between lines may be improved by compensating for Vdata, which is a voltage of data to be input to Vgs, through calculation of an emission time. An equation of relationship between Vgs and Luminance for compensation for Vgs is as below.

<Equation of Relationship Between Gain of Input Data (Vgs) and Emission Time>

$$I_{OLED} = k(V'_{gs} - V_{th})^2$$

$$\text{Luminance} = P \times I_{OLED}$$

$$\text{※} \, V'_{gs} = V_{gs} + V_{th}$$

k=Mobility

P=L-I Parameter [Equation 1]

Figure 13:
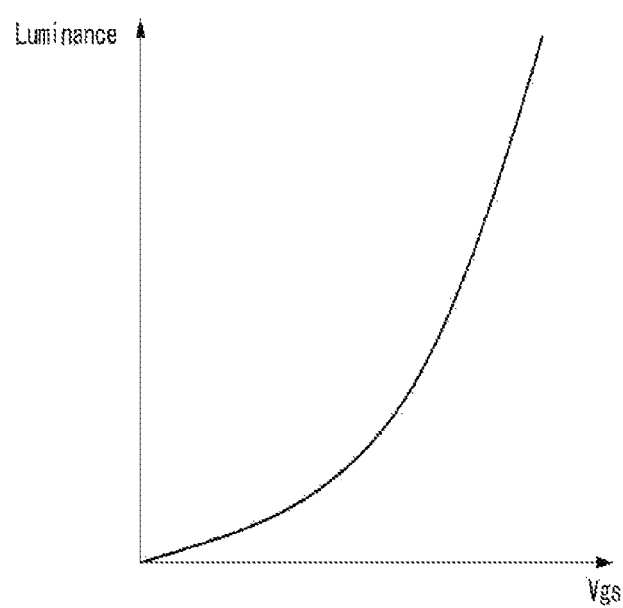
FIG. 13 is a graph illustrating a variation in luminance of an OLED according to variation in Vgs and a current.

A graph showing a relationship between Vgs and luminance based on the above equation is depicted in FIG. 13. As illustrated in FIG. 13, luminance of an OLED is proportional to the square of Vgs. To increase luminance of the OLED, it is necessary to increase an amount of Vgs.

Based on this principle, if an emission time is reduced because a duty is changed in each frame, luminance can be compensated by increasing Vgs as much as a reduction in luminance.

Figure 14:
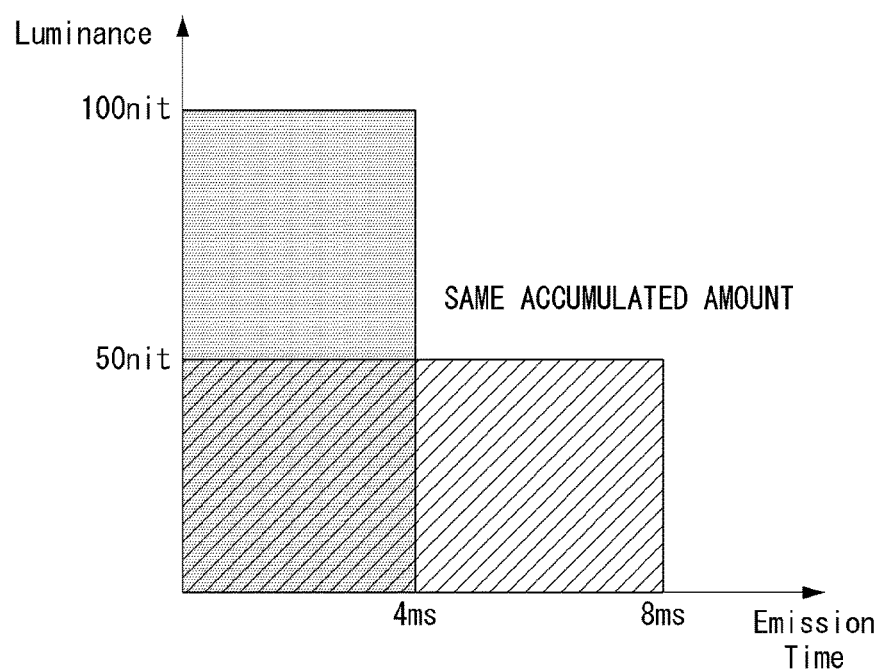
FIG. 14 is a graph showing the principle of correcting luminance of an OLED in response to a duty variation.

FIG. 14 is a graph illustrating the principle of correcting luminance of an OLED in response to a duty variation.

Referring to FIG. 14, if data required to emit 50 nit (1 nit=cd/m$^2$) for 8 ms is controlled to emit for 4 ms, luminance needs to be increased as much as the reduced emission time so as to achieve the same amount of luminance accumulated.

That is, if an emission time is reduced by ½ from 8 ms to 4 ms, it is necessary to increase luminance by double. If this is applied to [Equation 1], it will be presented as below.

$$\text{Luminance} = P \times I_{OLED} \rightarrow 2 \times \text{Luminance} = 2P \times I_{OLED}$$

$$2P \times I_{OLED} = 2Pk(V'_{gs} - V_{th})^2 = Pk(4V_{gs} + V_{th} - V_{th})^2$$

$$\therefore V'_{data} = V_{data} \times \left(\frac{\text{Emission Time Ref.}}{\text{Emission Time}}\right)^2$$

As found in the above equation, V'data which is a correction value of Vdata may be presented as in the following [Equation 2].

$$V'_{data} = V_{data} \times \left(\frac{\text{Emission Time } Ref.}{\text{Emission Time}}\right)^2 \qquad \text{[Equation 2]}$$

Figure 15:
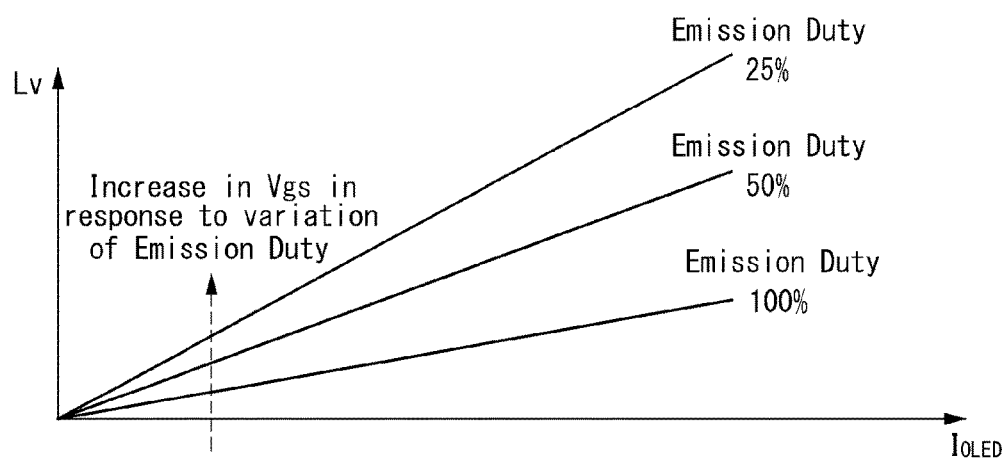
FIG. 15 is a graph showing a corrected state of Vgs in response to a duty variation.

FIG. 15 is a graph showing a relationship between a duty variation and Vgs. As an emission duty decreases, an emission time is reduced. That is, if the emission duty is reduced from 100% through 50% to 25%, the emission time is reduced to ½ and ¼. The present invention corrects input data Vdata so as to compensate for a loss of luminance caused by the reduction of the emission time. The magnitude of Vgs of the driving TFT increases due to the corrected input data V'data, and, as a result, a current value input to an OLED increases and this lead to an increase of luminance of the OLED. That is, an emission time is reduced but the level of luminance is increased. Thus, it is possible to prevent degradation of image quality by performing correction so as to achieve the same amount of luminance accumulated.

As described above, by reducing a programming time based on characteristics of image data, the prevent invention controls an emission duty to thereby secure a sufficient blank time. In this manner, it is possible to secure a relatively long blank time despite increase in resolution, and thus, it is possible to perform various control functions, such as a real-time sensing function, a black data writing function, and a driving TFT compensation function, in the blank time.

Furthermore, as input data is corrected to compensate for a loss of luminance caused due to a duty control, a display panel emits relatively more bright light during a relatively short period of time, so that a loss of luminance caused by a duty control operation may be compensated and degradation of image quality may be prevented.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device comprising:
a display panel on which a plurality of pixels connected to data lines, reference lines, and gate lines are arranged, wherein each of the pixels comprises an Organic Light Emitting Diode (OLED) and a driving Thin Film Transistor (TFT) for controlling a driving current flowing in the OLED in accordance with a gate-source voltage;
a data drive circuit configured to supply a data voltage to the data lines and a reference voltage to the reference lines;
a gate drive circuit configured to generate a scan signal and a sensing signal and supply the scan signal and the sensing signal to the gate lines, wherein the scan signal is to be synchronized with the data voltage and the sensing signal is to be synchronized with the reference voltage; and
a timing controller configured to divide one frame into a programming time, an emission time, and a non-emission time to drive the display panel, and control an emission duty by variably controlling the programming time based on a result of analysis of input image data, wherein the programming time is a period of time in which the gate-source voltage is set for the driving current, the emission time is a period of time in which the OLED emits light in accordance with the driving current, and the non-emission time is a period of time in which the OLED stops emitting light,
wherein, in a cinema view mode in which an empty area is displayed in upper and lower parts of the display panel, the timing controller sets the gate-source voltage for areas, except for the empty area, for the driving current, so that the programming time is reduced,
wherein, when the emission time is reduced as a result of controlling of the emission duty, the timing controller corrects data Vdata, which is input to a driving TFT of a corresponding OLED, into a corrected data V'data based on the following equation:

$$V'_{data} = V_{data} \times \left(\frac{\text{Emission Time } Ref.}{\text{Emission Time}}\right)^2. \qquad \text{[Equation]}$$

2. The display device of claim 1, wherein, when the result of analysis of the input image data shows that image data of one or more lines is maintained as identical data, the timing controller controls the gate drive circuit so that a gate output corresponding to the one or more lines are turned on simultaneously.

3. The display device of claim 1, wherein the timing controller controls the gate drive circuit so that gate outputs corresponding to lines displaying the empty area are turned on at the same time.

4. The display device of claim 1, wherein, when the emission time is reduced as a result of controlling of the emission duty, the timing controller corrects a voltage of input data so that a gate-source voltage to be input to the driving TFT of a corresponding OLED is increased.

5. The display device of claim 4, wherein, when controlling the emission duty, the timing controller calculates a gray level of input image data, and, in response to the calculated gray level being equal to or less than a reference value, corrects a gate-source voltage to be input to the driving TFT of a corresponding OLED.

6. A driving method of a display device which comprises a display panel on which a plurality of pixels connected to data lines, reference lines, and gate lines are arranged, wherein each of the pixels comprises an Organic Light Emitting Diode (OLED), a driving Thin Film Transistor (TFT) for controlling a driving current flowing in the OLED in accordance with a gate-source voltage, the method comprising:
supplying a data voltage to the data lines and a reference voltage to the reference lines;
generating a scan signal and a sensing signal and supplying the scan signal and the sensing signal to the gate lines, wherein the scan signal is to be synchronized with the data voltage and the sensing signal is to be synchronized with the reference voltage;
dividing one frame into a programming time, an emission time, and a non-emission time to drive the display panel, and controlling an emission duty by variably controlling the programming time based on a result of analysis of input image data, wherein the programming time is a period of time in which the gate-source voltage is set for the driving current, the emission time is a period of time in which the OLED emits light in accordance with the driving current, and the non-emission time is a period of time in which the OLED stops emitting light; and
in a cinema view mode in which an empty area is displayed in upper and lower parts of the display panel, setting the gate-source voltage for areas, except for the empty area, for the driving current, so that the programming time is reduced, wherein, when the emission time is reduced as a result of controlling of the emission duty, the timing controller corrects data Vdata, which is input to a driving TFT of a corresponding OLED, into a corrected data V'data based on the following equation:

$$V'_{data} = V_{data} \times \left(\frac{\text{Emission Time } Ref.}{\text{Emission Time}}\right)^2. \quad \text{[Equation]}$$

7. The driving method of claim 6, wherein, when the result of analysis of the input image data shows that image data of one or more lines is maintained as identical data, the method comprises:

controlling the gate drive circuit so that a gate output corresponding to the one or more lines are turned on simultaneously; and setting the gate-source voltage for lines, except for lines in which the gate output is turned on, so that the gate-source voltage is set for the driving current.

8. The driving method of claim 6, further comprising, when the emission time is reduced as a result of controlling the emission duty, correcting a voltage of an input data so that a gate-source voltage to be input to the driving TFT of a corresponding OLED is increased.

9. A display device comprising:

a display panel on which a plurality of pixels connected to data lines, reference lines, and gate lines are arranged, wherein each of the pixels comprises an Organic Light Emitting Diode (OLED) and a driving Thin Film Transistor (TFT) for controlling a driving current flowing in the OLED in accordance with a gate-source voltage;

a data drive circuit configured to supply a data voltage to the data lines and a reference voltage to the reference lines;

a gate drive circuit configured to generate a scan signal and a sensing signal and supply the scan signal and the sensing signal to the gate lines, wherein the scan signal is to be synchronized with the data voltage and the sensing signal is to be synchronized with the reference voltage; and a timing controller configured to divide one frame into a programming time, an emission time, and a non-emission time to drive the display panel, and control an emission duty by variably controlling the programming time based on a result of analysis of input image data, wherein the programming time is a period of time in which the gate-source voltage is set for the driving current, the emission time is a period of time in which the OLED emits light in accordance with the driving current, and the non-emission time is a period of time in which the OLED stops emitting light, wherein, when the emission time is reduced as a result of controlling of the emission duty, the timing controller corrects data Vdata, which is input to a driving TFT of a corresponding OLED, into a corrected data V'data based on the following equation:

$$V'_{data} = V_{data} \times \left(\frac{\text{Emission Time } Ref.}{\text{Emission Time}}\right)^2. \quad \text{[Equation]}$$

10. The display device of claim 9, wherein, when the result of analysis of the input image data shows that image data of one or more lines is maintained as identical data, the timing controller controls the gate drive circuit so that a gate output corresponding to the one or more lines are turned on simultaneously.

11. The display device of claim 9, wherein, in a cinema view mode in which an empty area is displayed in upper and lower parts of the display panel, the timing controller sets the gate-source voltage for areas, except for the empty area, for the driving current, so that the programming time is reduced.

12. The display device of claim 11, wherein the timing controller controls the gate drive circuit so that gate outputs corresponding to lines displaying the empty area are turned on at the same time.

13. The display device of claim 9, wherein, when the emission time is reduced as a result of controlling of the emission duty, the timing controller corrects a voltage of input data so that a gate-source voltage to be input to a driving TFT of a corresponding OLED is increased.

14. The display device of claim 13, wherein, when controlling the emission duty, the timing controller calculates a gray level of input image data, and, in response to the calculated gray level being equal to or less than a reference value, corrects a gate-source voltage to be input to a driving TFT of a corresponding OLED.

* * * * *